United States Patent [19]

Asaka

[11] Patent Number: 5,133,830
[45] Date of Patent: Jul. 28, 1992

[54] METHOD OF PRETREATMENT AND ANISOTROPIC DRY ETCHING OF THIN FILM SEMICONDUCTORS

[75] Inventor: Tatsuya Asaka, Suwa, Japan
[73] Assignee: Seiko Espon Corporation, Japan
[21] Appl. No.: 484,222
[22] Filed: Feb. 22, 1990
[30] Foreign Application Priority Data

| Apr. 7, 1989 [JP] | Japan | 1-88982 |
| Apr. 7, 1989 [JP] | Japan | 1-88983 |
| Apr. 7, 1989 [JP] | Japan | 1-88984 |
| May 30, 1989 [JP] | Japan | 1-136801 |

[51] Int. Cl.$^5$ .......................................... H01L 21/00
[52] U.S. Cl. .................................. 156/643; 156/646; 156/656
[58] Field of Search .............. 156/643, 646, 659.1, 156/656, 655, 664; 204/192.35

[56] References Cited

U.S. PATENT DOCUMENTS

| 4,361,461 | 11/1982 | Chang | 156/643 |
| 4,609,428 | 9/1986 | Fujimura | 156/643 |
| 4,622,094 | 11/1986 | Otsubo | 156/627 |
| 4,639,301 | 1/1987 | Doherty et al. | 204/192.31 |
| 4,640,737 | 2/1987 | Nagasaka et al. | 156/643 |
| 4,734,152 | 3/1988 | Geis et al. | 156/646 |
| 4,734,157 | 3/1988 | Carbaugh et al. | 156/643 |
| 4,734,158 | 3/1988 | Gillis | 156/643 |
| 4,778,561 | 10/1988 | Ghanbari | 156/643 |
| 4,795,529 | 1/1989 | Kawasaki et al. | 156/643 |
| 4,838,984 | 6/1989 | Luttmer et al. | 156/643 |
| 4,859,908 | 8/1989 | Yoshida et al. | 315/111.81 |
| 4,874,459 | 10/1989 | Coldren et al. | 156/643 |

FOREIGN PATENT DOCUMENTS

| 0191143 | 8/1986 | European Pat. Off. |
| 156760 | 12/1982 | Japan |
| 101429 | 6/1983 | Japan |

OTHER PUBLICATIONS

Journal of Vacuum Science & Technology, "Microwave Plasma Etching of Si and SiO2 in Halogen Mixtures", J. Pelletier, et al., vol. 7, No. 1, Jan.-Feb. 1989, pp. 59-67.
Applied Physics Letters, "Etching and Cathodoluminescence Studies of ZnSe", Clausen, et al., vol. 53, No. 8, Aug. 22, 1988, pp. 690-691.
M. W. Geis et al., "A Novel Anisotropic Dry Etching Method", Journal of Vacuum Science Technology, vol. 19(4), pp. 1390-1393, Nov./Dec. 1981.
M. W. Geis et al., "Hot-Jet Etching of Pb, GaAs, and Si", Journal of Vacuum Science Technology, vol. B 5(1), pp. 363-365 Jan./Feb. 1987.
M. W. Geis et al., "Summary Abstract: Etching With Direct Beams of Ions or Radicals", Journal of Vacuum Science Technology, vol. B 5(4), pp. 1928-1929, Jul.-/Aug. 1987.
K. Asakawa et al., "GaAs and GaAlAs Equi-Rate Etching Using a New Reactive Ion Beam Etching System", Japanese Journal of Applied Physics, vol. 22(10), pp. L653-L655, Oct., 1983.
E. M. Clausen et al., "Etching and Cathodoluminescence Studies of ZnSe", Applied Physics Letter, vol. 53(8), pp. 690-691, Aug., 1988.
K. Asakawa et al., "GaAs and GaAlAs Anisotropic Fine Pattern Etching Using a New Reactive Ion Beam Etching System", Journal of Vacuum Science Technology, vol. B 3(1), pp. 402-405, Jan./Feb. 1985.
K. Asakawa et al., "Optical Emission Spectrum of C2l ECR Plasma in the GaAs Reactive Ion Beam Etching (RIBE) System", Japanese Journal of Applied Physics, vol. 23(3), pp. L156-L158, Mar., 1984.

Primary Examiner—Thi Dang
Attorney, Agent, or Firm—W. Douglas Carothers, Jr.

[57] ABSTRACT

A microwave ECR plasma etching method and apparatus, including a plasma generating chamber coupled to a separate treatment chamber for supporting a Group II-VI sample to be dry etched, are tailored for the dry etching of Group II-VI compound semiconductors resulting in highly anisotropic etched patterns in Group II-VI materials having vertical side walls taking advantage of the ionicity of the constituents of Group II-VI compounds and utilizing a low ion energy level which will not damage the crystalline integrity of the Group II-VI material. A precleaning step is provided prior to dry etching of the Group II-VI sample thereby enhancing the etching rate of the dry etching treatment. In several embodiments, the microwave ECR plasma etching apparatus includes precleaning apparatus integral with the treatment chamber to preclean the Group II-VI sample surface prior to its transfer, without braking vacuum, to the treatment chamber.

7 Claims, 4 Drawing Sheets

METHOD OF PRETREATMENT AND ANISOTROPIC DRY ETCHING OF THIN FILM SEMICONDUCTORS

CROSS REFERENCE TO RELATED APPLICATIONS

This application contains subject matter related to the subject matter of patent application Ser. Nos. 07/484,786 and 07/485,058 both filed Feb. 22, 1990 and assigned to the same assigned herein and incorporated herein by reference thereto.

BACKGROUND OF THE INVENTION

This invention relates generally to methods for etching treatment of semiconductor structures and more particularly to microwave plasma anisotropic dry etching of thin film semiconductor structures and, specifically, to microwave generated plasma methods of etching II-VI compound semiconductor thin films or substrates employing a halogen reactive gas medium to chemically etch patterned semiconductor layers or substrates of semiconductor structures without significant surface or structural damage.

The manufacture of semiconductor devices and structures usually requires the selective etching of particular patterns in specific layers thereof. Previously, most etching of this type was wet etching, i.e., employing wet chemical materials that are applied to the patterned surface. In wet etching of II-VI compound semiconductors, the etching solutions primarily used are a solution of sodium hydroxide; hydrochloric acid; and a compound solution of nitric acid, hydrochloric acid, and water. These etching solutions are used at appropriate temperatures and with appropriate composition ratios as known in the art to achieve desired etching rate. However, the use of wet etching is isotropic in nature so that the resultant linewidth and pattern resolution of the wet etched pattern is not the same as the originally desired resist pattern. Further wet etching requires additional treatment steps of rinse and drying. Because of these mentioned factors, semiconductor structure yields are not uniform or high.

A common problem relative to wet etching is the lack of reproducibility. A predetermined etching rate cannot be achieved unless the temperature and the composition of etching solution are closely controlled. Also, where the etching solution contains a volatile material, the composition of the solution significantly changes over time. Therefore, etching rate of the wet etchant at the time when the solution is prepared and etching rate of the wet etchant at some later time are dramatically different. Furthermore, in wet etching, the pattern to be etched in a semiconductor layer or film cannot be formed to be the same as pattern of the mask because the etching is isotropic in nature, including side etching, resulting in a larger overall etched pattern. Also, the etching of patterns of processed sections are limited, for example, formation of vertical sections or deep vertical grooves with large length/breadth ratio is difficult to obtain.

Wet etching of Group II-V group compound semiconductors present more problems than wet etching of other semiconductors, such as, Group III-V group compound semiconductors. For example, in the case where etching of ZnSe is performed employing a hydrochloric acid and nitric acid etching solution, the etching solution penetrates into ZnSe and it is very difficult to completely remove etchant even with long periods of rinsing. As a result, there is a substantial degradation of film characteristics. Also, in the case where etching of ZnSe or $ZnS_xSe_{1-x}$ $(0<x\leq 1)$ is performed in the solution of NaOH, the surface morphology worsens extremely, therefore, these compounds are not particularly suitable for precision wet etching compared to Group III-V compound semiconductors. In the case where hydrochloric acid is employed as an etchant, the etching rate is very slow and, therefore, HCl is not practical for use in the fabrication and selective etching of Group II-VI compound semiconductors.

For many years, sputtering and ion milling or etching have been employed as dry etching techniques to accomplish, among other things, etching of semiconductor layers. In general, processing is carried out by establishing a DC or rf generated plasma with an inert atmosphere, such as Ar. An example of such processes are disclosed in U.S. Pat. No. 4,622,094. These techniques generally involve the formation of a plasma and the physical removal of materials from the semiconductor surface due to bombardment of the surface with ions. However, the accuracy of these techniques has left much to be desired, particularly relative, for example, to improvements to pattern resolution, surface morphology, attained anisotropy, etching depth and reduced mask erosion.

On the other hand, in the case of such dry etching, for example, ion etching employing an inert gas medium, such as Ar, in order to enhance the etching rate to a level of practical utilization, it is necessary to increase the plasma discharge power. However, this, in turn, results in substantial damage to a semiconductor materials.

More recently, there has been an increased interest in reactive dry etching techniques because these techniques, as compared to the above mentioned previous techniques, promise better pattern resolution in submicron large scale integration providing a higher degree of circuit density with improvements in surface morphology, increased anisotropy, lower thermal stress due to lower temperature processing, higher plasma densities at lower pressures, enhanced etching rates, enhanced selectivity ratio, deeper etching capability and reduced mask erosion. Further, they eliminate the need for the above mentioned post etching treatment steps employed in wet etching and improved to a great degree the accuracy can be achieved in the resultant linewidth and pattern resolution. As a result, semiconductor structure yields may be made more uniform and higher. These techniques generally involve the chemical removal of materials from the semiconductor surface or a combination of chemical and physical removal from the semiconductor surface comprising atoms or molecules of etched materials and products of the reaction between surface molecules and the reactive gas species.

Dry etching techniques include reactive ion etching (RIE), ion beam assisted etching (IBAE) and hot jet etching (HJE), and reactive ion beam etching (RIBE), such as microwave plasma dry etching, each of which involves a chemically reactive vapor or gaseous species, for example, comprising a halogen, such as $F_2$, $Br_2$ or $Cl_2$, in a vapor phase compound. In RIE, the sample or target to be etched is placed on a cathode in an electric field established between an anode and cathode in the presence of a selected flux of a chemically reactive species that reacts with atoms or molecules on the surface of the sample. The potential applied between the anode and cathode is sufficient to ionize atoms or molecules in the gas as well as produce radicals. The positively charged ions produced in the plasma are attracted to the cathode and upon impact physically remove or etch away material from the sample surface. The reactive species will also chemically react with atoms or molecules on the surface of the sample which are also removed by the incident ions on the surface of the sample. As an example of RIE, see U.S. Pat. No. 4,640,737.

In the case of reactive ion etching (RIE) employing a reactive gas, such as $BCl_3$, damage to the semiconductor materials is, to a degree, less compared to that of ion etching. In any case, damage to the surface of semiconductor materials under this etching treatment is still major and not acceptable. In order to reduce the damage, the gas pressure of the etching system may be raised while lowering the discharge power. However, the ion sheath width and the mean free path of the ions and neutral particles become almost the same, causing the beam of ions to lose directionality thereby increasing the potentiality of isotropic etching to occur. Thus, RIE provides a significant drawback to dry etch processing particularly for Group II-VI compound semiconductors.

In IBAE, a combination of ions from an inert gas, e.g., $Ar^+$, from an ion beam source and a flux of chemically active species, e.g., F or Cl, are directed to the sample and by control of the ion beam and the reactive species, a controlled anisotropic etching can be carried out. In the case of HJE, there is no ion beam employed and a flux of reactive radicals is formed and directed onto the sample. See, for example, the articles of M. W. Geis et al.: "A Novel Anisotropic Dry Etching Technique", *Journal of Vacuum Science Technology*, Vol. 19(4), pp. 1390-1393, November/December, 1981; "Hot-Jet Etching of Pb, GaAs, and Si", *Journal of Vacuum Science Technology*, Vol. B5(1), pp. 363-365, January/February, 1987; and "Summary Abstract: Etching With Directed Beams of Ions or Radicals", *Journal of Vacuum Science Technology*, Vol. A5(4), pp. 1928-1929, July/August, 1987. Also, see U.S. Pat. No. 4,874,459 relative to a modified IBAE method as well as a summary of other reactive dry method techniques mentioned in the background of this reference.

In RIBE, the source of ions (e.g., $Cl^+$) and radicals (e.g., $Cl^*$) is generally formed in and extracted out of a separate chamber and accelerated via an ion extraction grid or electrode into the etching chamber. See, for example, the article of K. Asakawa et al., "GaAs and GaAlAs Equi-Rate Etching Using a New Reactive Ion Beam Etching System", *Japanese Journal of Applied Physics*, Vol. 22(10), pp. L653-L655, October, 1983. Electron Cyclotron Resonance (ECR) microwave plasma source is employed which provides for higher efficiency in plasma generation and higher generation of reactive species achieving improved anisotropy and higher etching rates. Other examples are found in U.S. Pat. Nos. 4,795,529; 4,778,561; 4,609,428; 4,859,908 and 4,734,157.

Thus, reactive dry etching processes generically provide a source of reactive species in the form of either reactive ions, e.g. $Cl^+$, or reactive radicals, e.g. $Cl^*$, or a combination of reactive ions and radicals forming a reactive flux, e.g. $Cl^+$ and $Cl^*$, or a source of reactive species assisted by other ions, e.g. $Cl^+$ and/or $Cl^*$ in combination with $Ar^+$, that are generated, focussed and/or accelerated to the sample target to provide a chemical action at the sample surface with surface molecules and sputter or otherwise remove reaction products from the sample surface via the outlet affluent.

It is of importance to note that all of the foregoing references relating to various dry etching techniques are methods that have specifically evolved for the purpose of etching Group III-V materials, e.g., GaAs and AlGaAs. The techniques have not been generally applied to Group II-VI compound semiconductors, such as ZnSe, ZnS, or $ZnS_xSe_{1-x}$, because the developed treatments, as reported in these references, have not been designed for these compounds and their attempted application according to their specific teachings would provide etching rate that are not of a practical level and would result in damage to the crystalline structure without good anisotropy. Further, problems persist in the utilization of these etching techniques of the prior art, particularly in the case of Group II-VI compound semiconductors wherein both selective wet etching and dry etching techniques have been used employing a mask comprising an insulation film, such as photoresist, $SiO_2$, or the like. In particular, good anisotropy has not been obtained, particularly in connection with masking techniques, and good selectivity ratio has not been achieved.

It is an object of this invention to provide an improved method of reactive ion beam etching (RIBE).

It is another object of this invention to provide a reactive ion beam etching (RIBE) method particularly suitable for Group II-VI compound semiconductors.

It is another object of this invention to provide modified reactive ion etch methods incorporating precleaning treatment to the semiconductor structures to be treated providing high anisotropy, enhanced etching properties and much improved surface morphology, particularly for Group II-VI compound semiconductors.

It is a further object of this invention to manufacture semiconductor structures employing Group II-VI compound semiconductors with excellent reproducibility by providing etching methods of Group II-VI compound semiconductors with high reproducibility, excellent practical use with no or negligible damage to etched semiconductor materials and with a capability of producing anisotropically patterns previously not realizable in the prior art.

SUMMARY OF THE INVENTION

According to this invention, a microwave ECR plasma etching method and apparatus, comprising a plasma generating chamber coupled to a separate treatment chamber for supporting a Group II-VI sample to be dry etched, are tailored for the dry etching of Group II-VI compound semiconductors resulting in highly anisotropic etched patterns in Group II-VI materials having vertical side walls taking advantage of the ionicity of the constituents of Group II-VI compounds and utilizing a low ion energy level which will not damage the crystalline integrity of the Group II-VI material. A precleaning step is provided prior to dry etching of the Group II-VI sample thereby enhancing the etching rate of the dry etching treatment. In several embodiments, the microwave ECR plasma etching apparatus includes precleaning apparatus integral with the treatment chamber to preclean the Group II-VI sample surface prior to its transfer, without breaking vacuum, to the treatment chamber.

The present invention demonstrates superior effects by precleaning of the surface of a Group II-VI compound semiconductors, such as ZnSe, ZnS, or $ZnS_xSe_{1-x}$, prior to etching with a reactive gas medium containing a halogenate, recognizing the fact that these compound semiconductors have higher ionicity than Group III-V compound semiconductors. Thus, in order to employ a RIBE method, it is necessary to take into consideration this ionicity if good anisotropy and minimal crystalline damage are to be attained. For example, if the particular disclosed treatment of Asakawa et al. for RIBE were to be utilized in connection with Group II-VI compound semiconductors, unacceptable levels of damage would generally occur.

We have discovered that since the ionicity of the constituents comprising Group II-VI compound semiconductors are high, they react much more readily with active halogen elements, such as Cl, compared to III-V compound semiconductors. As indicated from the work of Asakawa et al. and others, the etching mechanism of the RIBE method involves (1) the chemical adsorption of halogen ions or radicals to the surface of the sample to be dry etched, (2) chemical reaction with the sample constituents and (3) physical removal of reaction products from the sample surface constituents or materials. However, in the case of Group II-VI compound semiconductors, the removal of reaction products from the surface materials is by vapor pressure. As a result, the etching rate is large for a lower ion energy level, e.g., employing an acceleration or lead voltage in the range of 0 V to 600 V, preferably below 300 V, compared to ion energy levels employed in the case of Group III-V compound semiconductors. With the application of lower ion energy levels while achieving a comparable or acceptable etching rate for practical use relative to etching Group II-VI compound semiconductors, correspondingly, damage to the crystalline structure is minimized or negligible.

Further, the constituents of Group II-VI compound semiconductors form reaction products which, in most cases, produce two halogen reaction products. For example, in the case of RIBE dry etching of ZnSe with Cl ions, the reaction products are $ZnCl_x$ and $SeCl_x$, such as, $ZnCl_2$ and $SeCl_2$. From a chemical point of view, these reaction products are not very active. Therefore, after they are formed at the sample surface and evaporate, they will be swiftly carried away due to the vapor pressure of the system and will not side etch the side walls of the masked pattern being etch in the sample because of their low reactive nature and their swift removal. As a result, clean anisotropic etching in the direction of the applied ion beam is achieved. Compared to the reaction products formed relative to Group III-V compound semiconductors employing the RIBE method and Cl ions, such as $GaCl_2$, $GaCl_3$ and the like, after these reaction products evaporate, they may still producing side etching of the side walls of the pattern being etch in the sample because of their high reactive nature prior to their removal from the immediate region of the sample surface. Thus, the application of the RIBE method to Group II-VI compound semiconductors under the proper controlled conditions provides for enhanced anisotropic etching compared to Group III-V compound semiconductors.

Employing reactive ion beam etching produced by microwave excitation and an ECR plasma of Group II-VI compound semiconductors, as compared to the wet etching technique or dry etching, such as, IRE or RIBE methods of the prior art, provides for superior reproducibility and controllability in the process. In particular, damage to semiconductor materials is dramatically reduced. Further, by controlling the ion beam and the shape of the etching mask, precision process of, for example, grooves with taper or vertical walls having perpendicular cross section or diagonal groove is fully possible. Furthermore, since etching rate can be controlled by choosing from various reactive gas and the stability of plasma can be achieved, etching depth can be controlled with good reproducibility. Also, good morphology, such as, extremely smooth etching side surfaces, and achievement of the exact, desired etching pattern of the mask pattern are obtainable.

Under the methods of this invention, the etching process can be carried out under low pressure conditions thereby reducing to a minimum damage to the crystalline structure, particularly with the provision of a precleaning treatment prior to performing RIBE dry etching. Therefore, regardless of the chosen etching rate, etching to a desired interface, for example, can be detected with precision and in a reproducible manner. Thus, reproducibility between batches in dry etching of Group II-VI compound semiconductors is dramatically increases, thereby rendering simplified mass production of semiconductor integrated circuits and devices.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
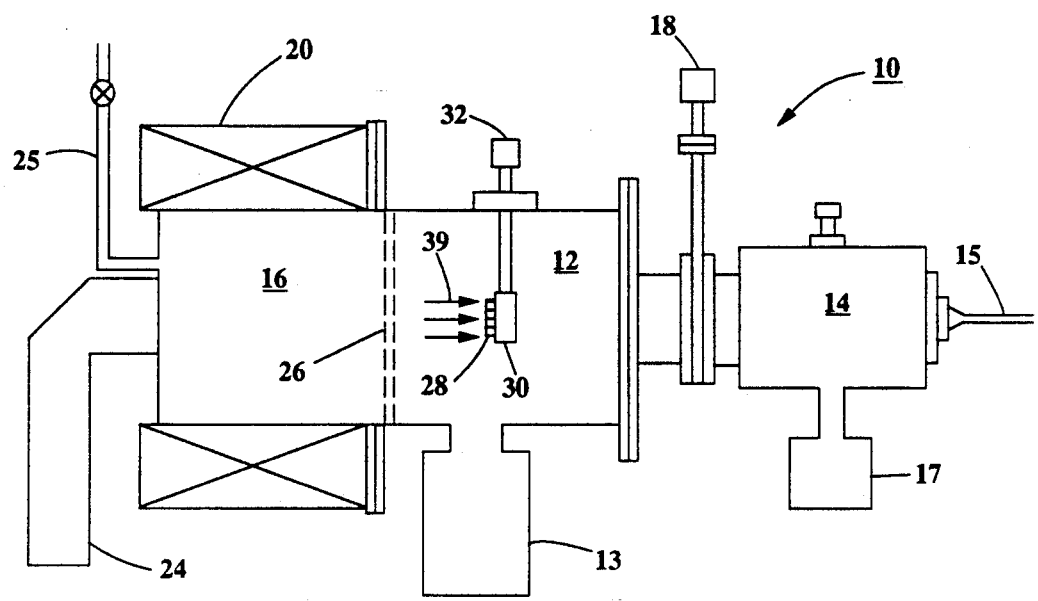
FIG. 1 is a schematic cross sectional illustration of a microwave plasma etching apparatus employed in connection with the dry etching of semiconductor structures employing a reactive gas medium.

Reference is now made to FIG. 1 wherein there is shown a cross sectional schematic view of a microwave plasma etching apparatus 10 employed in connection with this invention. Apparatus 10 comprises an etching chamber 12 coupled to a sample preparation chamber 14 by means gate valve interlock 18. A highly pure, halogen gaseous element, e.g., Cl$_2$, is employed in the practice of this invention and is highly reactive so that these two chambers 12 and 14 are maintained under separate environments and valve 18 is opened when passing a sample 28 to and from chamber 12 from and to preparation chamber 14 via sample transfer rod 15. Chamber 14 has its own UHV evacuation system 17. The air locked etching chamber 12 is maintained under high vacuum condition via an UNV evacuation system 13.

Etching chamber 12 is directly open to ECR plasma chamber 16 which produces a high intensity plasma which is excited by a combination microwave, introduced into chamber 16 via microwave waveguide 24 and quartz plate window (not shown), and a magnetic filed provided by cylindrical magnetic coil 20. Also, a highly pure halogen gas, such as Cl$_2$, forming one component of the reactive gas medium is introduced via inlet 25. Another component of the reactive gas medium, such as, Ar, H or N, or combinations thereof may be introduced in another inlet (not shown). For the purposes of initial explanation and background, however, reference will be made only to the use of Cl$_2$ via inlet 25.

The microwave power from waveguide 24 creates discharges in the Cl$_2$ gas in chamber 16 and a plasma is generated which contains electrons, ions and radicals. Electrons, generated by the microwave, repeatedly collide with gas molecules and atoms while performing cyclotron movement within chamber 16 caused by the symmetric magnetic field produced by coil 20. When the intensity of the generated magnetic field is, for example, 875 Gauss, the revolution cycle matches with the microwave frequency, for example, 2.45 GHz, and a cyclotron resonance phenominum is created and resonance is achieved in electron absorption of microwave energy. Therefore, discharge continues even when gas pressure is low, thereby providing a high plasma density and a long and useful life for the reactive gas medium. Also, because the electrons and ions are in cyclotronic motion and are gather toward the center of chamber 16 because of the established electric field distribution, any sputtering effect produced by the ions on the side walls of plasma chamber 12 is minimal and, thus, provides a pure plasma which is unidirectional and perpendicular to the planar extent of sample 28 in etching chamber 10.

The ions and radicals generated in plasma chamber 16 generally have linear motion while the electrons have cyclotron motion and are retained within plasma chamber 16. However, the ions and radicals are accelerated as a beam by extraction grid or electrode 26 toward sample 28 in a path perpendicular to the planar extent of sample 28 when applied acceleration or lead voltage is applied to electrode 26. The ions and radicals impinging sample 28 chemically react with the surface material of sample 28 and form volatile products which are removed from region of sample 28 by the sputtering action of the ions and evacuated from chamber 10 via evacuation system 13.

Sample 28 is supported on sample holder 30 in chamber 10. Holder 30 may be rotated 360° about a vertical axis by manipulator 32 so that the direction of the beam emanating from chamber 16 can be made incident at an angle relative to the planar extent of sample 28. Also, holder 30 may be provided with a heater/cooling section (not shown) for the purpose of heating or cooling sample 28 to a controlled predetermined temperature.

Figure 2A:
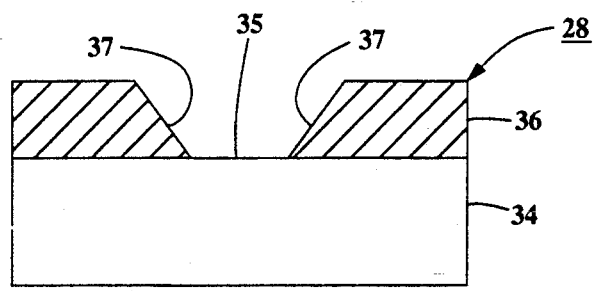
FIGS. 2A and 2B are schematic cross sectional illustrations of a ZnSe semiconductor sample for the purpose of illustrating the etching method comprising this invention as practiced in the apparatus shown in FIG. 1.

FIG. 2A illustrates a cross sectional view of a sample 28 prior to etching in accordance with the method of this application. Sample 28 comprises substrate 34 of a Group II–VI compound semiconductor, e.g., ZnSe. While this example, as well as subsequently discussed samples, illustrates a Group II–VI compound semiconductor substrate, the sample may also be a Group II–VI compound semiconductor layer or a plurality of layers. A mask 36 comprising, for example, a positive type photoresist material, is formed on substrate 34 and a desired pattern 35 is formed in mask 36 employing conventional photolithography. Since mask 36 is formed by conventional photolithography, the cross sectional pattern of mask 36 will have a natural taper shape, as illustrated at 37.

A method of dry etching for sample 28 utilizing apparatus 10 was performed as follows. The results relative to this sample are referred in later discussions as the "original embodiment". Chlorine gas was employed as the reactive gas medium and this medium was 99.999% pure chlorine. The gas pressure of the system was $1.0 \times 10^{-1}$ Pa, the microwave inlet power was 100 W, the lead voltage was 500 V, the sample temperature was 25° C., and the direction of ion beam irradiation (indicated by arrows 39 in FIGS. 1 and 2B) was perpendicular relative to the planar extent of sample 28.

Figure 2B:
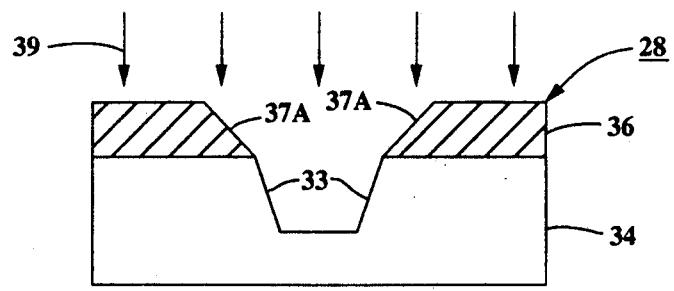

FIG. 2B illustrates a cross sectional view of sample 28 after etching. The etching rate of ZnSe was approximately 600 Å/min. while the etching rate of the positive type photoresist, comprising mask 36, was approximately 200 Å/min. This mask etching rate is applicable in the case where the mask had been post baked for 30 minutes at 120° C. The etching rate varies to a certain degree depending upon the type of photoresist employed and the baking conditions, e.g., temperature and time, employed, particularly the temperature. A sufficiently good selectivity ratio is obtained if the photoresist baking temperature is in the range of about 120° C. to 250° C. Since the pattern of etching mask 36 has a taper shape 37 and sputtering effect of the beam also causes slight etching of etching mask 36. This is evident in FIG. 2B in that mask 36 has been reduced in thickness and its taper 37A is more pronounced compared to FIG. 2A. Also, the etched region of ZnSe in sample 28 is also taped as shown at 33. Thus, even where the ion beam is irradiated perpendicularly relative the planar extent of ZnSe in sample 28, a perpendicular cross section cannot be achieved in the ZnSe material, i.e., anisotropic etching is not obtained in spite of the normal incident of ion beam 39 on sample 28. On the other hand, for practical use in etching applications, the etching rate achieved in this embodiment is sufficient. Further, the uniformity in distribution of the etching rate on the etched material across the extent of the sample surfaces in the case where the substrate sample size was 20 mm × 20 mm was about or less than ±5%, and the surface morphology of the sample was about the same as the surface morphology before etching treatment.

Figure 3A:
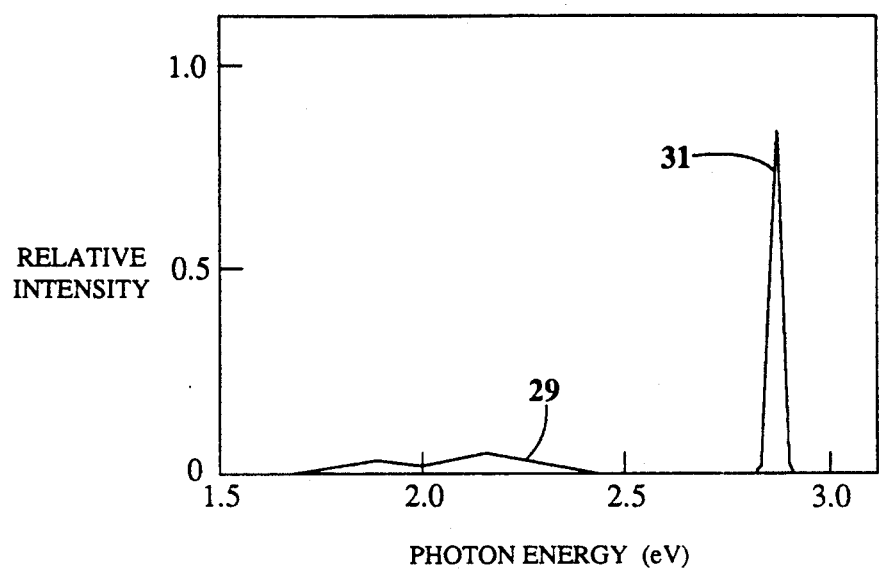
FIGS. 3A and 3B are graphic illustrations of the photoluminescence spectra for a ZnSe layer respectively before and after etching in accordance with the method of this invention.
Figure 3B:
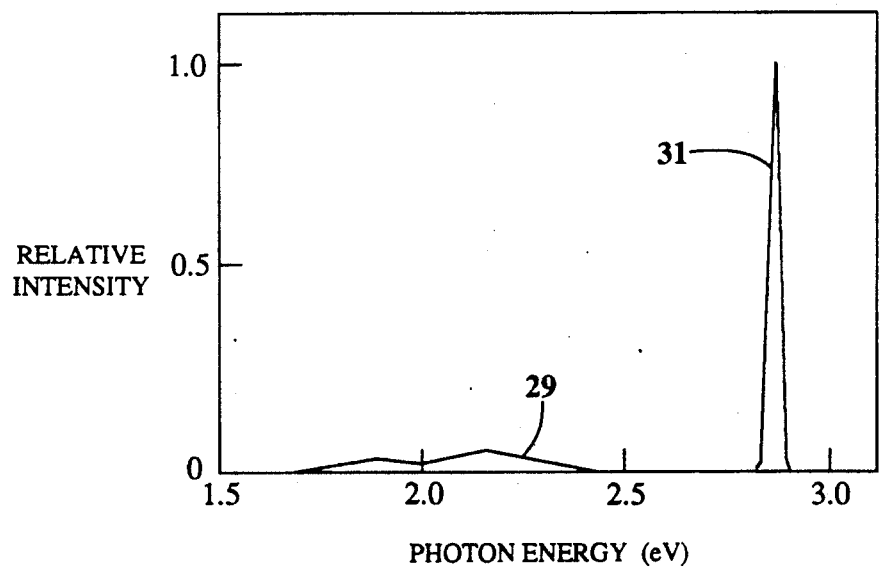

FIG. 3A and FIG. 3B illustrate the comparison of photoluminescence spectra of ZnSe substrate 34 before and after the etching under the above mentioned conditions. FIG. 3A is the photoluminescent spectra before etching and FIG. 3B is the photoluminescent spectra after etching. The deep level luminescence 29 and the band edge luminescence 31 are illustrated in each of these figures. The lower the deep level 29, the less crystalline damage that occurs to the sample material. Since the ratio of relative intensity of luminescence of the band edge 31 relative to the deep level 29 is approximately 50 both before and after etching, it is clear that there is essentially no damage resulting to semiconductor substrate 34.

Examples representing the effective etching conditions for practical applications relative to this original embodiment for use in processing Group II-VI compound semiconductor structures are now described.

Figure 4:
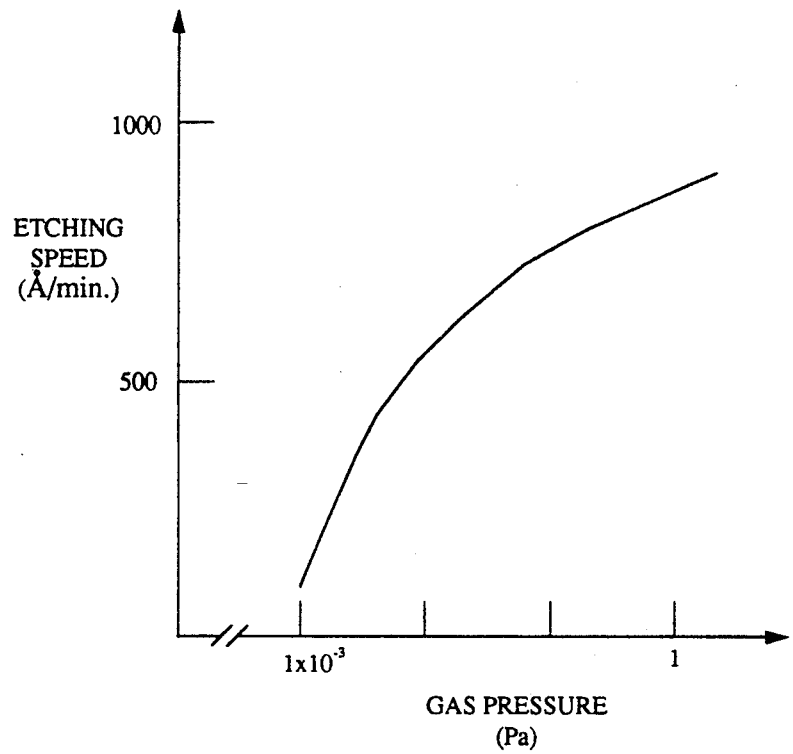
FIG. 4 is a graphic illustration of the relationship of etching rate relative gas pressure relative to the practice of the method of this invention.

Qualitatively speaking, the etching rate increases as the gas pressure increases, as determined from experimental data illustrated in FIG. 4 wherein the lead voltage was maintained around 500 V and the microwave power was maintained around 80 W. However, when the gas pressure is too high, plasma discharge will not occur. Even when discharge occurs, such as at or above 1 Pa, the ion sheath width and the mean free path of the ions and radicals become substantially the same thereby causing the ion beam to lose its directionality. Therefore, these high pressure conditions are not suitable for etching treatment. When the gas pressure is too low, such as at or below $1 \times 10^{-3}$ Pa, the etching rate progresses too slow, therefore, it is not suitable for practical applications.

Table 1 shows the relationship of the etching rate of ZnSe relative to the gas pressure when the microwave inlet power is 100 W, the lead or acceleration voltage is 500 V and pure chlorine gas is employed as the etching gas medium. As can be seen from Table 1, as the gas pressure becomes lower, so does the etching rate and lateral (side) or isotropic etching is negligible or nonexistent. The term, "slight", in Table 1 may be expressed by a guideline indicative of the degree of lateral or side etching. If the mean depth of etching is A and the maximum depth of resultant lateral etching is B, then the degree of side etching is expressed as B/A. "Slight" lateral etching condition means that the ratio of $B/A \leq 0.1$. There is no practical problems relative to the use of etched II-VI compound semiconductors in the manufacture of semiconductor devices or IC structures with a ratio of $B/A \leq 0.1$.

Figure 5:
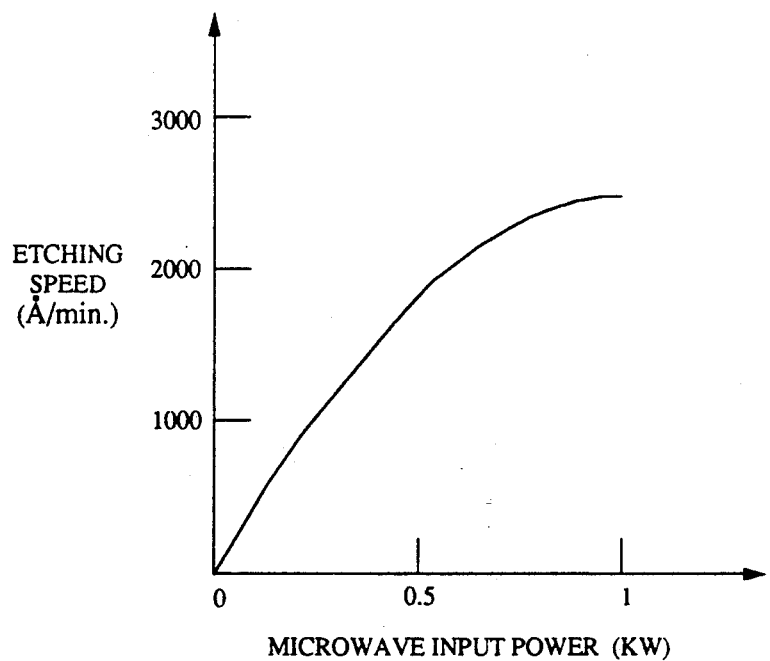
FIG. 5 is a graphic illustration of the relationship of etching rate relative to microwave input power relative to the practice of the method of this invention.

As determined from experimental data illustrated in FIG. 5, wherein the gas pressure was maintained around $1 \times 10^{-1}$ Pa and the lead voltage was maintained around 450 V, etching rate increases as the microwave inlet power increases because the plasma density becomes more intense as microwave excitation is increased. However, when the microwave inlet power is too high, the plasma temperature becomes too high deforming electrode 26. Also, temperature control of sample 28 becomes difficult because the sample temperature also rises due to the microwave power extending into etching chamber 12. Good etching results are, therefore, achieved with microwave power in the power range of 1 W to 1 KW.

TABLE 1

| Gas Pressure (Pa) | Etching Rate (Å/min) | Lateral Etching Condition |
|---|---|---|
| $5 \times 10^{-3}$ | 100 | None |
| $1 \times 10^{-2}$ | 500 | None |
| $5 \times 10^{-2}$ | 650 | None |
| $1 \times 10^{-1}$ | 700 | None |
| $5 \times 10^{-1}$ | 800 | Slight |
| 1.0 | 1,000 | Slight |

Table 2 shows the dependency characteristics of the etching rate of ZnSe relative to the microwave inlet power when the etching medium comprises pure chlorine gas, the gas pressure is $1 \times 10^{-1}$ Pa, and the lead voltage is 400 V. As can be seen in Table 2, the etching rate increases with the microwave inlet power.

TABLE 2

| Microwave Inlet Power (W) | Etching Rate (Å/min) |
|---|---|
| 50 | 200 |
| 100 | 700 |
| 150 | 900 |
| 200 | 1,000 |
| 400 | 1,300 |
| 600 | 1,900 |
| 1,000 | 2,100 |

Figure 6:
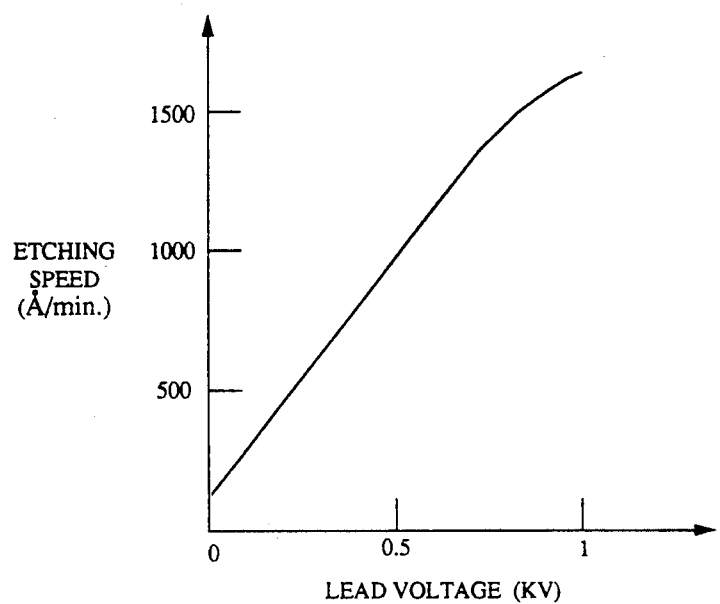
FIG. 6 is a graphic illustration of the relationship of etching rate relative to lead voltage relative to the practice of the method of this invention.

As illustrated in FIG. 6, wherein the gas pressure was maintained around $1 \times 10^{-1}$ Pa and the microwave power was maintained around 200 W, the etching rate increases as the lead voltage increases. However, if the voltage is too high, such as at or above 1 KV, physical sputtering of the sample becomes too strong causing substantial damage to the substrate crystalline structure. When lead voltage is 0 V, and the substrate temperature is approximately 200° C., etching by radical species of Cl is accomplished and isotropic etching of the sample will occur.

Table 3 shows the dependency characteristics of the etching rate of ZnSe relative to the lead voltage when the etching gas is pure chlorine gas, the gas pressure is $1 \times 10^{-1}$ Pa, and the microwave inlet power is 200 W. To be noted is that as the lead voltage increases, so does the etching rate and a point is reached, i.e., at about 700 V, when damage begins to occur to the crystalline structure of the sample.

TABLE 3

| Lead Voltage (V) | Etching Rate (Å/min) | Substrate Damage |
|---|---|---|
| 200 | 500 | None |
| 300 | 700 | None |
| 400 | 850 | None |
| 500 | 1,000 | None |
| 600 | 1,200 | None |
| 700 | 1,300 | Slight |
| 800 | 1,500 | Slight |
| 1,000 | 1,600 | Yes |

The forgoing original embodiment and discussed conditions for optimum reactive dry etching are principally the subject matter of patent application Ser. No. 07/484,786 and have been presented here as background and for the purposes of comparison with several embodiments of this application which are next to be discussed. In all embodiments, the same type of sample 28 disclosed in FIG. 2A was employed in some cases in connection with apparatus 10 and in other cases in connection with apparatus 40.

The commonality of these subsequent embodiments is that a precleaning treatment is performed prior to application of the dry etching treatment previously discussed relative to the original embodiment.

In the first embodiment, cleaning of the surface of a sample substrate 34 with a hydrogen ion beam was performed prior to application of the etching treatment. Before this pretreatment, a mask 36 comprising, for example, a positive type photoresist material is formed on substrate 34 and a pattern 35 was formed in mask 36 employing conventional photolithography forming sample 28. After placing sample 28 on sample holder 30 in apparatus 10 of FIG. 1, precleaning of the substrate surface was performed by employing a hydrogen ion beam formed from 99.9999% pure hydrogen plasma wherein the hydrogen was provided at inlet 25. The gas pressure was $1.0 \times 10^{-1}$ Pa, the microwave inlet power was 100 W, the lead voltage was 400 V, the sample temperature was 25° C., and the ion beam irradiation direction was perpendicular relative to the planar extent of substrate 34. A highly clean surface was obtained because any impurities present on the substrate surface were sputtered away by the action of the hydrogen ions.

Next, dry etching was performed on sample 28 under conditions wherein 99.999% pure chlorine gas was employed as the reactive gas medium. The gas pressure of the system was $1.0 \times 10^{-1}$ Pa, the microwave inlet power was 100 W, the lead voltage was 500 V, the sample temperature was 25° C., and the ion beam irradiation direction was perpendicular relative to the planar extent of sample 28. The etching rate of ZnSe was approximately 600 Å/min. The etching rate of the positive type photoresist was approximately 200 Å/min when a post bake condition is set for 30 minutes at 120° C. Stability and reproducibility of the etching rate for given conditions was improved due to the precleaning treatment of the substrate surface with a hydrogen ion beam prior to etching compared to the case where such precleaning was not performed, as in the case of the original embodiment. The distribution of the etching rate when the substrate was 20 mm×20 mm was about ±3% or less. The surface morphology was substantially the same as the surface morphology before treatment. Also, it was discovered that precleaning of the substrate surface with hydrogen ions was effective in suppressing any occurrence of any lateral or side etching in the subsequent dry etching treatment. This was determined by examination of the sample of this first embodiment compared with a sample of the original embodiment where no such precleaning treatment was performed.

Figure 7:
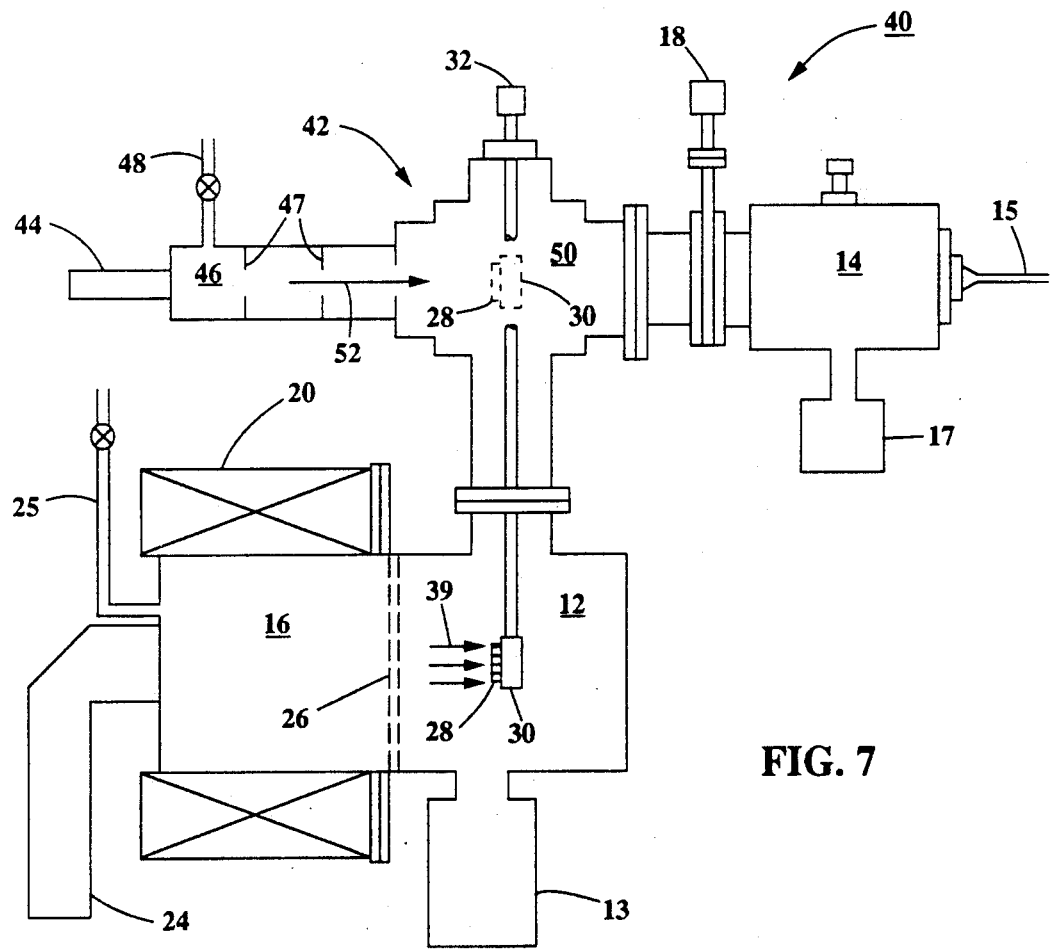
FIG. 7 is a schematic cross sectional illustration of a microwave plasma etching apparatus having a precleaning section employed in the practice of this invention.

In the second embodiment, the substrate surface was pretreated with hydrogen radicals prior to the application of the previously explained dry etching treatment. FIG. 7 illustrates microwave plasma etching apparatus 40 employed in connection with this embodiment. Apparatus 40 has connected treatment chambers 50 and 12 for respectively precleaning of the substrate surface prior to dry etching and etching of the sample upon completion of the precleaning treatment. Apparatus 40 is substantially identical to apparatus 10 shown in FIG. 1 except for rearrangement of the system and the inclusion of the pretreatment section 42 to apparatus 10. Thus, the description relative to FIG. 1 is equally applicable to FIG. 7 so that the same numerals correspond to identical components involved and, therefore, the description will not be repeated here and is incorporated by reference thereto.

Pretreatment section 42 comprises microwave waveguide inlet 44 connected to plasma chamber 46 via a quartz window or the like (not shown) in which a high density plasma is formed from hydrogen gas introduced through inlet 48. Since plasma chamber 46 is ventilated differentially relative to connected precleaning chamber 50, hydrogen radicals are generated in the plasma discharge and they are projected into precleaning chamber 50 due to thermal kinetic energy as indicated by arrow 52. Since plasma chamber 46 does not contain an ion acceleration electrode, hydrogen ions formed in the plasma in chamber 46 will not move into cleaning chamber 50 and, thus, only hydrogen radicals proceed from chamber 46 into precleaning chamber 50 in the form of a radical beam via the action of baffle plates 47 in chamber 46. Sample holder 30, shown in solid line as positioned in etching chamber 12, may be moved upwardly and positioned in precleaning chamber 50, as shown in dotted line in precleaning chamber 50, by means of sample transfer rod 32. Sample 28 on holder 30 is positioned in chamber 50 to be in line and perpendicular with the projection of the hydrogen radical beam 52. Before precleaning, a mask 36 comprising, for example, a positive type photoresist material, was formed on substrate 34 and a pattern 35 was formed in mask 36 employing conventional photolithography thereby completing sample 28 as per FIG. 2A. Then, sample 28 is cleaned with hydrogen radical beam 52. Sample 28 is then heated by means of a resistance heater (not shown) located within sample holder 30. The heat on sample 28 increases the cleansing action of the chemically reactive etching of the hydrogen radical beam.

Precleaning of the substrate surface by the hydrogen radical beam was performed with a 99.9999% pure hydrogen gas source. The gas pressure of the system was $1.0 \times 10^{-2}$ Pa, the microwave inlet power was 100 W, the sample temperature was 400° C., and the hydrogen radical beam irradiation direction was perpendicular relative to the planar extent of sample 28. A highly clean substrate surface was obtained because impurities present on the surface were actively etched away or otherwise removed by the sputtering action of the hydrogen radical beam.

Dry etching was then performed under conditions wherein 99.9999% pure chlorine gas was employed as the reactive gas medium. The gas pressure of the system was $1.0 \times 10^{-1}$ Pa, the microwave inlet power was 100 W, the lead voltage was 500 V, the sample temperature was 25° C., and the ion beam irradiation direction was perpendicular relative to the planar extent of the substrate. The etching rate of ZnSe was approximately 700 Å/min. The etching rate of the positive type photoresist was approximately 200 Å/min. when the post bake condition is set for 30 minutes at 120° C. Stability and reproducibility of the etching rate was improved because of the precleaning of substrate 34 by hydrogen radical beam before the performing of the dry etching treatment, compared to the case, such as the original embodiment, wherein precleaning was not performed. The uniformity of the distribution of the etching rate on substrate 34 when the substrate was 20 mm×20 mm was about ±3% or less. The surface morphology was subtantially the same as the surface morphology before treatment.

In the third embodiment, precleaning of the surface of a ZnSe sample 28 was accomplished by employing a rare gas ion beam supplied in pretreatment section 42 of apparatus 40. Before precleaning, a mask 36 comprising, for example, a positive type photoresist material was formed on substrate 34 and a pattern 35 was formed in mask 36 employing conventional photolithography thereby completing sample 28. A 99.9999% pure argon gas was employed in pretreatment section 42 via inlet 48 as the reactive gas medium. The gas pressure of the system was $1.0 \times 10^{-1}$ Pa, the microwave inlet power was 100 W, the lead voltage was 400 V, the sample temperature was 25° C., and the argon ion beam irradiation direction was perpendicular relative to the planar extent of the substrate. A highly clean substrate surface was obtained because impurities and contaminants present on the sample surface were etched away or otherwise actively removed by the sputtering action of the argon ion beam.

Dry etching was then performed under conditions wherein 99.999% pure chlorine gas was employed as the reactive gas medium. The gas pressure of the system was $1.0 \times 10^{-1}$ Pa, the microwave inlet power was 100 W, the lead voltage was 500 V, the sample temperature was 25° C., and the ion beam irradiation direction was perpendicular relative to the planar extent of sample 28. The etching speed of ZnSe was approximately 700 Å/min. The etching rate of the positive type photoresist was approximately 200 Å/min. when the post bake condition is set for 30 minutes at 120° C. Stability and reproducibility of etching rate was improved over the case of the original embodiment, where no precleaning treatment was performed, because of the cleaning action of the argon ion beam before performing the dry etching treatment. The uniformity of the distribution of the etching rate across the substrate when the substrate was 20 mm×20 mm was about ±3% or less. The surface morphology was subtantially the same as the surface morphology before treatment.

In the fourth embodiment, precleaning of the surface of a ZnSe substrate 34 was accomplished by employing an acidic solution prior to dry etching treatment. Precleaning with an acidic solution prior to dry etching was performed as follows. A mask 36 comprising, for example, a positive type photoresist material was formed on substrate 34 and a pattern 35 was formed in mask 36 employing conventional photolithography thereby completing sample 28. The ZnSe sample 28 was first soaked in a solution of hydrochloric acid (35% weight) and water with mixture ratio of 1:1 for 15 seconds. Then, substrate 34 was rinsed with distilled water. A very thin layer on the surface of substrate 34 was removed by the etching action of HCl solution providing a clean substrate surface. After water rinsing, substrate 34 was then rinsed in isopropyl alcohol and blown dry with nitrogen gas.

Substrate 34 was then secured to sample holder 30 of apparatus 10 and etching was performed under conditions wherein 99.999% pure chlorine gas was employed as the reactive gas medium. The gas pressure was $1.0 \times 10^{-1}$ Pa, the microwave inlet power was 100 W, the lead voltage was 500 V, the sample temperature was 25° C., and the ion beam irradiation direction was perpendicular relative to the planar extent of sample 28. The etching rate of ZnSe was approximately 700 Å/min. The etching rate of the positive type photoresist was approximately 200 Å/min. when the post bake condition is set for 30 minutes at 120° C. Stability and reproducibility of the same etching rate from sample batch to sample batch is improved over the case of the original embodiment, wherein no precleaning treatment was performed, due to the cleaning action performed by the acid treatment. The uniformity of the distribution of the etching rate across the substrate when the substrate was 20 mm×20 mm was about ±3% or less. The surface morphology was subtantially the same as the surface morphology before treatment.

While the invention has been described in conjunction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. In a method of reactive ion beam etching of Group II-VI compound semiconductors comprising the steps of
    precleaning the surface of a Group II-VI sample by irradiating the surface of said Group II-VI sample with a hydrogen ion or radical beam in a vacuum,
    supplying a halogen gas other than fluorine in a microwave excitation ECR plasma chamber coupled to a treatment chamber for treating said Group II-VI sample in a vacuum,
    forming a reactive gas plasma containing reactive species in said plasma chamber and
    irradiating said Group II-VI sample with a beam of reactive species formed from said reactive gas plasma to anisotropically etch said Group II-VI sample.

2. The method of reactive ion beam etching of Group II-VI compound semiconductors of claim 1 wherein said precleaning step is performed in a precleaning chamber connected directly to said treatment chamber and including the step of moving said Group II-VI sample from said pretreatment chamber to said treatment chamber without breaking vacuum to perform the etching step.

3. In a method of reactive ion beam etching of Group II-VI compound semiconductors comprising the steps of
    precleaning the surface of a Group II-VI sample by irradiating the surface of said Group II-VI sample with an inert gas beam in a vacuum,
    supplying a halogen gas other than fluorine in a microwave excitation ECR plasma chamber coupled to a treatment chamber for treating said Group II-VI sample in a vacuum,
    forming a reactive gas plasma containing reactive species in said plasma chamber and irradiating said Group II-VI sample with a beam of reactive species formed from said reactive gas plasma to etch said Group II-VI sample.

4. The method of reactive ion beam etching of Group II-VI compound semiconductors of claim 3 wherein said inert gas is argon.

5. The method of reactive ion beam etching of Group II-VI compound semiconductors of claim 4 wherein said precleaning step is performed in a precleaning chamber connected directly to said treatment chamber and including the step of moving said Group II-VI sample from said pretreatment chamber to said treatment chamber without breaking vacuum to perform the etching step.

6. In a method of reactive ion beam etching of Group II-VI compound semiconductors comprising the steps of
    precleaning the surface of a Group II-VI sample by soaking the surface of said Group II-VI sample in an acidic solution,
    supplying a halogen gas other than fluorine in a microwave excitation ECR plasma chamber coupled to a treatment chamber for treating said Group II-VI sample,
    forming a reactive gas plasma containing reactive species in said plasma chamber and
    irradiating said Group II-VI sample with a beam of reactive species formed from said reactive gas plasma to etch said II-VI sample.

7. The method of reactive ion beam etching of Group II-VI compound semiconductors of claim 6 wherein said acidic solution is diluted hydrochloric acid.

* * * * *